United States Patent
Chen et al.

(10) Patent No.: US 9,899,297 B1
(45) Date of Patent: Feb. 20, 2018

(54) SEMICONDUCTOR DEVICE HAVING A THROUGH-SILICON VIA AND MANUFACTURING METHOD THEREOF

(71) Applicant: TAIWAN SEMICONDUCTOR MANUFACTURING CO., LTD., Hsinchu (TW)

(72) Inventors: Pu-Fang Chen, Hsinchu (TW); Victor Y. Lu, Foster City, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/281,315

(22) Filed: Sep. 30, 2016

(51) Int. Cl.
*H01L 23/48* (2006.01)
*H01L 21/76* (2006.01)
*H01L 21/324* (2006.01)
*H01L 21/768* (2006.01)
*H01L 29/32* (2006.01)
*H01L 23/532* (2006.01)
*H01L 25/065* (2006.01)
*H01L 25/00* (2006.01)

(52) U.S. Cl.
CPC ......... *H01L 23/481* (2013.01); *H01L 21/324* (2013.01); *H01L 21/76852* (2013.01); *H01L 21/76898* (2013.01); *H01L 23/53238* (2013.01); *H01L 25/0657* (2013.01); *H01L 25/50* (2013.01); *H01L 29/32* (2013.01); *H01L 2225/06541* (2013.01)

(58) Field of Classification Search
CPC combination set(s) only.
See application file for complete search history.

(56) References Cited

U.S. PATENT DOCUMENTS

| 7,713,852 | B2 | 5/2010 | Chen |
| 8,299,583 | B2 * | 10/2012 | Zhu ................ H01L 21/76898 257/351 |
| 8,680,682 | B2 | 3/2014 | Yu et al. |

(Continued)

FOREIGN PATENT DOCUMENTS

| JP | H6-295912 A | 10/1994 |
| TW | 201230279 A | 7/2012 |

(Continued)

OTHER PUBLICATIONS

Office Action issued in corresponding Taiwanese Patent Application No. 106125101, dated Nov. 22, 2017.

*Primary Examiner* — Mamadou Diallo
(74) *Attorney, Agent, or Firm* — McDermott Will & Emery LLP

(57) ABSTRACT

In a method of manufacturing a semiconductor device, a thermal treatment is performed on a substrate, thereby forming a defect free layer in an upper layer of the substrate, where a remaining layer of the substrate is a bulk layer. A density of defects in the bulk layer is equal to or more than $1 \times 10^8$ cm$^{-3}$, where the defects are bulk micro defects. An electronic device is formed over the defect free layer. An opening is formed in the defect free layer such that the opening does not reach the bulk layer. The opening is filled with a conductive material, thereby forming a via. The bulk layer is removed so that a bottom part of the via is exposed. A density of defects in the defect free layer is less than 100 cm$^{-3}$.

20 Claims, 7 Drawing Sheets

(56) References Cited

U.S. PATENT DOCUMENTS

| | | | | |
|---|---|---|---|---|
| 8,803,206 B1* | 8/2014 | Or-Bach | ............. | H01L 25/0657 |
| | | | | 257/278 |
| 2008/0179678 A1* | 7/2008 | Dyer | ....................... | H01L 21/84 |
| | | | | 257/351 |
| 2009/0068835 A1* | 3/2009 | La Tulipe, Jr. | ... | H01L 21/76804 |
| | | | | 438/656 |
| 2011/0193240 A1* | 8/2011 | Farooq | .................... | B32B 15/20 |
| | | | | 257/774 |
| 2013/0207214 A1* | 8/2013 | Haddad | ............... | H01L 31/0236 |
| | | | | 257/432 |
| 2013/0267046 A1 | 10/2013 | Or-Bach et al. | | |
| 2015/0179447 A1* | 6/2015 | Ryou | ...................... | H01L 29/04 |
| | | | | 257/798 |
| 2016/0141274 A1* | 5/2016 | Or-Bach | ............. | H01L 25/0657 |
| | | | | 257/659 |

FOREIGN PATENT DOCUMENTS

| | | |
|---|---|---|
| TW | 201442208 A | 11/2014 |
| TW | 201546902 A | 12/2015 |

\* cited by examiner

SEMICONDUCTOR DEVICE HAVING A THROUGH-SILICON VIA AND MANUFACTURING METHOD THEREOF

TECHNICAL FIELD

The present disclosure relates generally to semiconductor devices and, more particularly, to semiconductor devices having through-silicon vias.

BACKGROUND

Through-silicon vias (TSVs) are formed in a semiconductor wafer by initially forming an opening at least partially in the semiconductor wafer (e.g., Si substrate), and forming a conductive material in the opening. The TSV electrically connects electronic devices (e.g., transistors) formed on the front surface of the substrate and a terminal formed at the rear (back) surface of the substrate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

FIGS. 1-9 show exemplary cross sectional views illustrating a manufacturing process of a through-silicon via (TSV) structure according to one embodiment of the present disclosure. General fabrication operations of a TSV may be found in U.S. Pat. No. 8,680,682, the entire contents of which in incorporated herein by reference.

Figure 1:
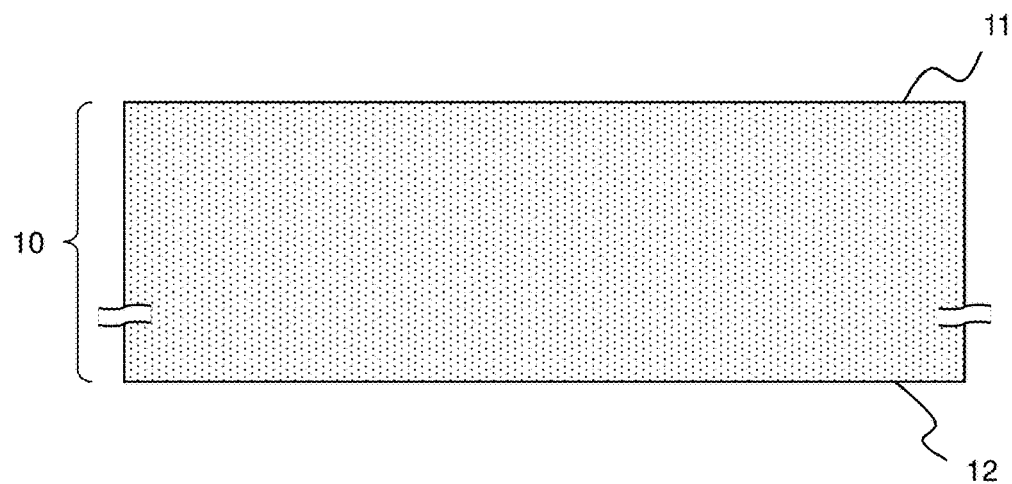
FIG. 1 shows an exemplary cross sectional view illustrating one of the stages of a manufacturing process for a through-silicon via (TSV) structure according to one embodiment of the present disclosure.

In FIG. 1, a substrate 10 is provided. The substrate 10 has a first (e.g., front) side 11 and a second (rear) side 12 opposite the first side 11, and may be a bulk silicon wafer, which is doped with impurity or undoped, or an active layer of a silicon-on-insulator (SOI) substrate. The substrate 10 may comprise other semiconductors, such as Group IV-IV compound semiconductors such as SiC and SiGe, Group III-V compound semiconductors such as GaAs, GaP, GaN, InP, InAs, InSb, GaAsP, AlGaN, AnnAs, AlGaAs, GaInAs, GaInP, and/or GaInAsP; or combinations thereof.

In one embodiment, a Si substrate (wafer) is used. Generally, a silicon wafer as provided by a wafer manufacture includes defects, such as bulk micro defects (BMDs). BMD generally refer to oxygen precipitates in silicon, and may include oxygen precipitates, voids, inclusions, slip lines, etc. Crystal Originated Particles (or Pits) (COP) may be included in BMD.

The BMDs in the silicon layer below electronic device (e.g., MOS transistors) act as a gettering site to keep impurities away from the MOS transistors. BMDs can be detected by illuminating a sample with IR (infrared) light and looking at it with a camera that is sensitive to IR.

In one embodiment of the present disclosure, the density of BMDs in the silicon substrate 10 (initial number) is equal to or more than $1 \times 10^8$ cm$^{-3}$. A typical density of BMDs in a silicon wafer formed by a CZ method may be defined by industrial standards, such as SEMI Standard or JEITA standard. The number of BMDs can be determined by counting etch pits created by wet etching using KOH.

Figure 2:
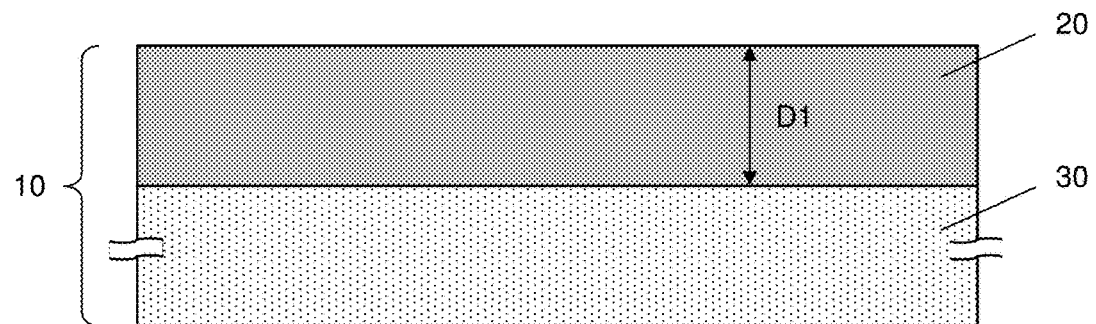
FIG. 2 shows an exemplary cross sectional view illustrating one of the stages of a manufacturing process for a through-silicon via (TSV) structure according to one embodiment of the present disclosure.

In the present disclosure, a defect free layer (BMD free layer or denuded zone) 20 is formed at least in the front surface (upper surface) region of the substrate 10, as shown in FIG. 2. The defect free layer 20 is formed at the beginning of the wafer process. In some embodiments, the defect free layer 20 is formed before any ion implantation, patterning or film formation operations. In other words, the operations for forming the defect free layer 20 are performed on a so-called "bare wafer" as manufactured by a wafer manufacturer.

In one embodiment, a thermal treatment is performed to form the BMD free layer 20. The thermal treatment may include a rapid thermal annealing (RTA) method, heating in a furnace or a laser annealing method. The thermal treatment is performed on the substrate 10 after cleaning the substrate 10.

In the thermal treatment, the substrate 10 is heated at a temperature in a range from about 1150° C. to about 1300° C., in some embodiments. In certain embodiments, the substrate 10 is heated at a temperature in a range from about 1200° C. to about 1250° C. The temperature is increased from, for example, room temperature (25° C.), to the desired temperature at a temperature increasing rate in a range from about 50° C./sec to about 100° C./sec, in some embodiments. The thermal treatment is performed for a time period in a range from about 5 sec to about 20 sec in some embodiments. In certain embodiments, the thermal treatment is performed for a time period in a range from about 10 sec to about 15 sec. After the thermal treatment is performed at the above temperature, a cooling process is performed at a cooling rate in a range from about 10° C./sec to about 30° C./sec, in some embodiments. In certain embodiments, the cooling process is performed at a cooling rate in a range from about 15° C./sec to about 25° C./sec. The cooling rate is lower than the temperature increasing rate. It is noted that a lower cooling rate can create a wider defect free layer. The cooling process may be performed by multiple steps with different cooling rates. In some embodiments, a fast cooling operation with a first cooling rate is performed followed by a slow cooling operation with a second cooling rate lower than the first cooling rate. In such a case, the first cooling rate is in a range from about 15° C./sec to about 30° C./sec and the second cooling rate is in a range from about 10° C./sec to about 25° C./sec. Three or more steps of reducing the cooling rate may be performed. In certain embodiments, the cooling rate is gradually decreased.

By adjusting one or more of the temperature, the process time and the cooling rate, the thickness (depth) D1 of the defect free layer 20 can be controlled. In some embodiments, the thickness D1 of the defect free layer 20 is in a range from about 30 μm to about 200 μm. In certain embodiments, D1 is equal to or more than about 50 μm and equal to or less than 100 μm, and in other embodiment, D1 is in a range about 60 μm to about 90 μm. The remaining layer of the substrate 10 is referred to as a bulk layer 30, which still contains BMDs equal to or more than $1 \times 10^8$ cm$^{-3}$. It is noted that the defect free layer 20 should not be made too thick, because the BMDs in the silicon layer below electronic device act as gettering sites.

The density of BMDs in the defect free layer 20 is substantially zero (e.g., less than 100 cm$^{-3}$). In certain embodiment, the density of BMDs in the defect free layer 20 is zero.

In certain embodiment, depending on a method of thermal treatment, a defect free layer is also formed in the bottom (rear) surface of the substrate 10.

Figure 3:
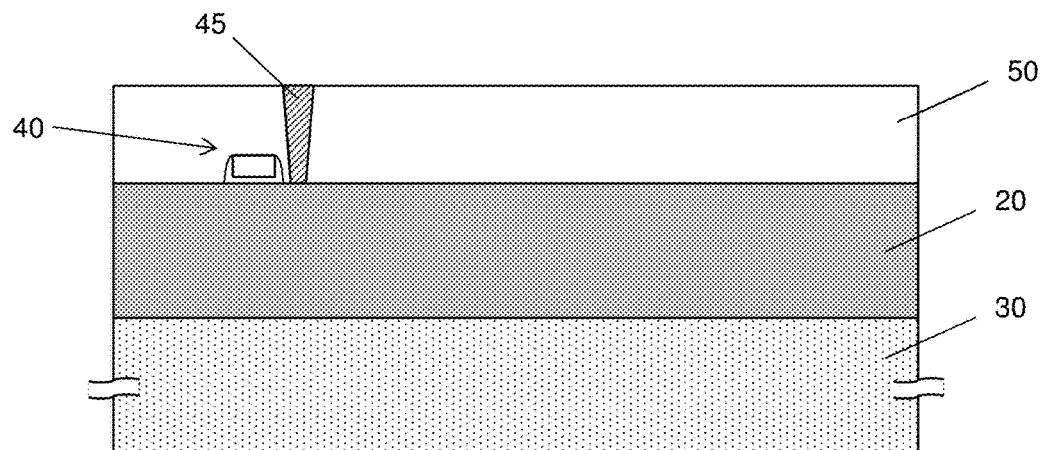
FIG. 3 shows an exemplary cross sectional view illustrating one of the stages of a manufacturing process for a through-silicon via (TSV) structure according to one embodiment of the present disclosure.

After the defect free layer 20 is formed, isolation structures (e.g., shallow trench isolation (STI)) is formed, ion implantation operations are performed, and electronic devices such as MOS FETs, metal wirings and contacts, etc. are fabricated on the defect free layer 20, as shown in FIG. 3. In FIG. 3, only a MOS FET 40 covered by an interlayer dielectric (ILD) layer 50 and a contact 45 passing through the ILD layer 50 are illustrated as a conceptual illustration of the electronic devices. Of course, multiple layers of wiring layers, interlayer dielectric layers and vias/contacts, or other passive or active electronic devices are also formed on the substrate 10 to provide the desired structural and functional requirements of the overall circuit design. The electronic devices may be formed using any suitable methods either within or on the surface of the substrate.

The ILD layer 50 is formed over the substrate 10 and the electronic device 40 by chemical vapor deposition (CVD), sputtering, or any other suitable method. The ILD layer 50 typically has a planarized surface and may be comprised of silicon oxide, although other materials, such as low-k materials, could alternatively be utilized.

The contact 45 extends through the ILD layer 50 to make electrical contact with at least one of the electronic devices 40. The contact 45 may be formed through the ILD layer 50 by using photolithography and etching techniques. The contact 45 may comprise a barrier/adhesion layer (not shown) to prevent diffusion and provide better adhesion between the contact 45 and the ILD layer 50. In an embodiment, the barrier layer is formed of one or more layers of titanium, titanium nitride, tantalum, tantalum nitride, or the like. The barrier layer may be formed through CVD, sputtering or other techniques. The barrier layer may be formed to a combined thickness of about 1 nm to about 50 nm in some embodiments. The contact 45 may be formed of any suitable conductive material, such as a highly-conductive, low-resistive metal, elemental metal, transition metal, or the like. In an exemplary embodiment, the contacts 45 are formed of tungsten, although other materials, such as copper, nickel, cobalt, aluminum or an alloy thereof could alternatively be utilized.

Figure 4:
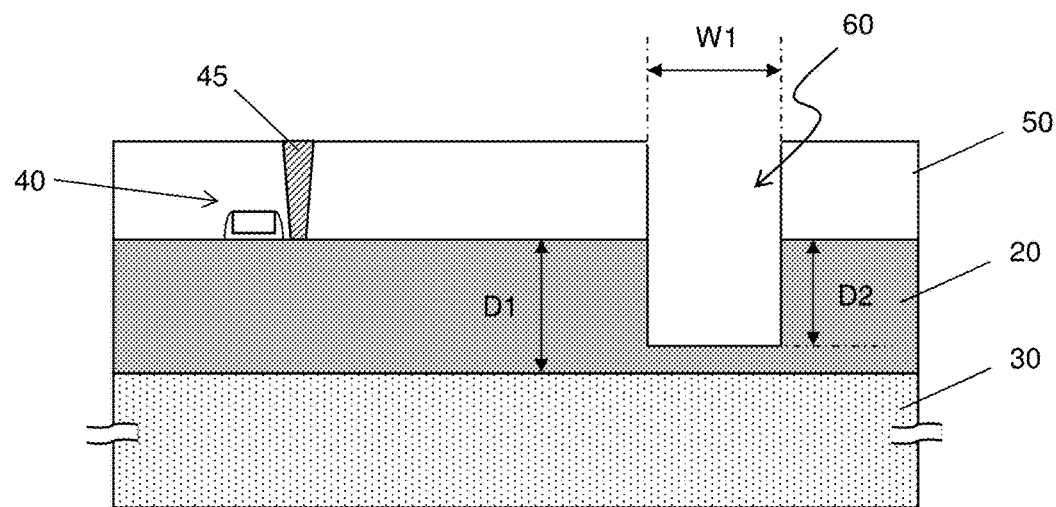
FIG. 4 shows an exemplary cross sectional view illustrating one of the stages of a manufacturing process for a through-silicon via (TSV) structure according to one embodiment of the present disclosure.

As shown in FIG. 4, an opening 60 is formed through the ILD layer 50 and into the defect free layer 20 of the substrate 10. In the present disclosure, the opening 60 does not reach the bulk layer 30 of the substrate 10, as shown in FIG. 4. A distance between the bottom of the opening 60 and the bulk layer 30 is in a range from about 50 nm to about 200 nm in some embodiments.

The opening 60 may be formed by applying and developing a suitable photoresist (not shown), and then etching the ILD layer 50 and at least a portion of the defect free layer 20 of the substrate 10. The opening 60 is formed so as to extend into the substrate 10 at least further than the electronic devices 40 formed within but not to reach the bulk layer 30. Accordingly, the depth D2 of the opening measured from the upper surface of the substrate 10 is less than the thickness D1 of the defect free layer 20. In some embodiments, the depth D2 is about 70% to about 95% of the thickness D1 of the defect free layer 20, and in certain embodiments, D2 is about 80% to about 90% of D1. Further, the opening 60 has a diameter W1 in a range from about 2 µm to about 70 µm, in some embodiment.

However, in other embodiments, the opening 60 may be formed concurrently with or before the formation of the ILD layer 50. Any method of formation to form the opening 60 is included within the scope of the present subject matter.

Figure 5:
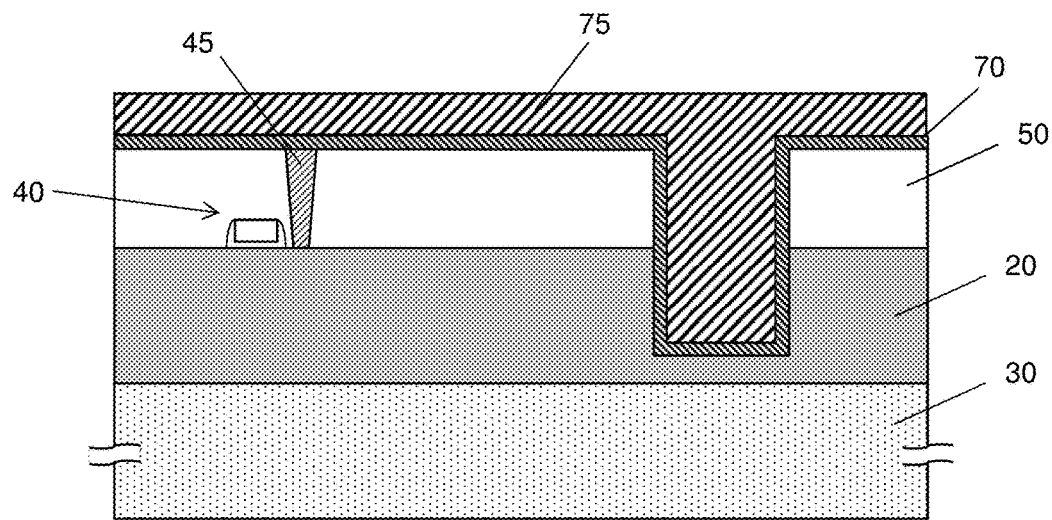
FIG. 5 shows an exemplary cross sectional view illustrating one of the stages of a manufacturing process for a through-silicon via (TSV) structure according to one embodiment of the present disclosure.

After the opening 60 is formed, a barrier layer 70 and a main conductive layer 75 are formed in the opening 60 and over the upper surface of the ILD layer 50, as shown in FIG. 5. The barrier layer 70 is conformally formed to cover the sidewalls and the bottom of the opening 60, but does not completely fill the opening 60. The thickness of the barrier layer 70 is in a range from about 1 nm to about 100 nm in some embodiments, and is in a range from about 2 nm to about 10 nm in other embodiments. By forming the barrier layer 70 conformally, the barrier layer will have a substantially equal thickness along the sidewalls of the opening 60 and also along the bottom of the openings 60.

The barrier layer 70 may be formed using a process that will promote a conformal formation, such as plasma enhanced CVD, plasma enhanced physical vapor deposition (PEPVD) and atomic layer deposition (ALD).

The barrier layer 70 comprises one or more layers of Ti, TiN, Ta ad TaN. Additionally, in some embodiments, the barrier layer 70 may be alloyed with an alloying material such as carbon or fluorine, although the alloyed material content is generally no greater than about 15% of the barrier layer 70, and may be less than about 5% of the barrier layer 70. The alloying material may be introduced by one of the precursors during formation of the barrier layer 70 in the ALD, PECVD, or PEPVD processes.

The main conductive layer 75 may comprise copper, although other suitable materials such as aluminum, alloys thereof, doped polysilicon, combinations thereof, may alternatively be utilized. The main conductive layer 75 may be formed by electroplating copper onto the barrier layer 70, filling and overfilling the openings 60. In some embodiments, a seed layer (not shown) is formed on the barrier layer before forming the main conductive layer 75.

Figure 6:
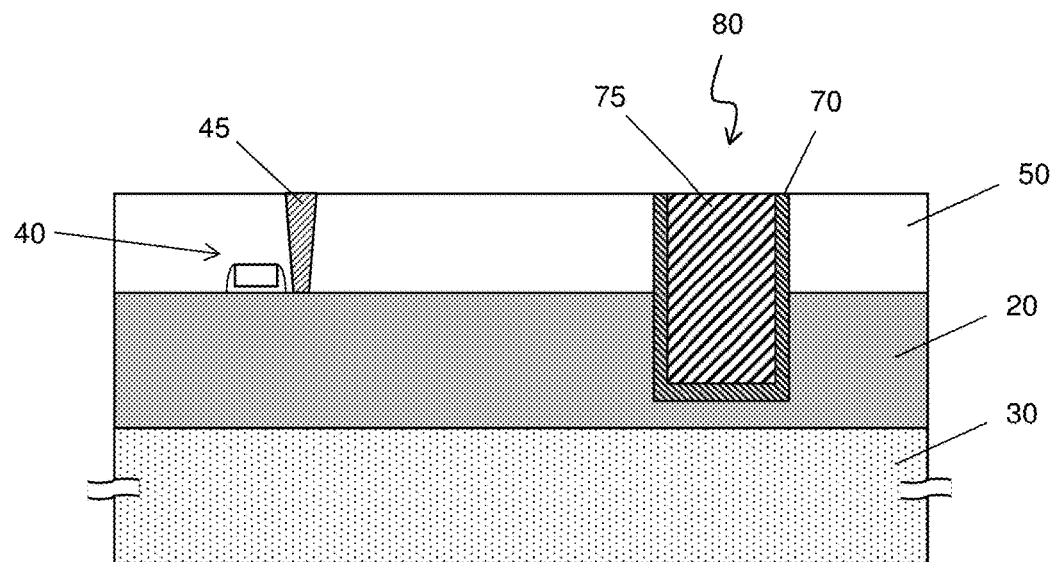
FIG. 6 shows an exemplary cross sectional view illustrating one of the stages of a manufacturing process for a through-silicon via (TSV) structure according to one embodiment of the present disclosure.

Once the openings 60 have been filled, excess barrier layer 70 and main conductive layer 75 outside of the openings 60 are removed through a planarization process such as chemical mechanical polishing (CMP), as shown in FIG. 6, thereby forming a via 80.

Figure 7:
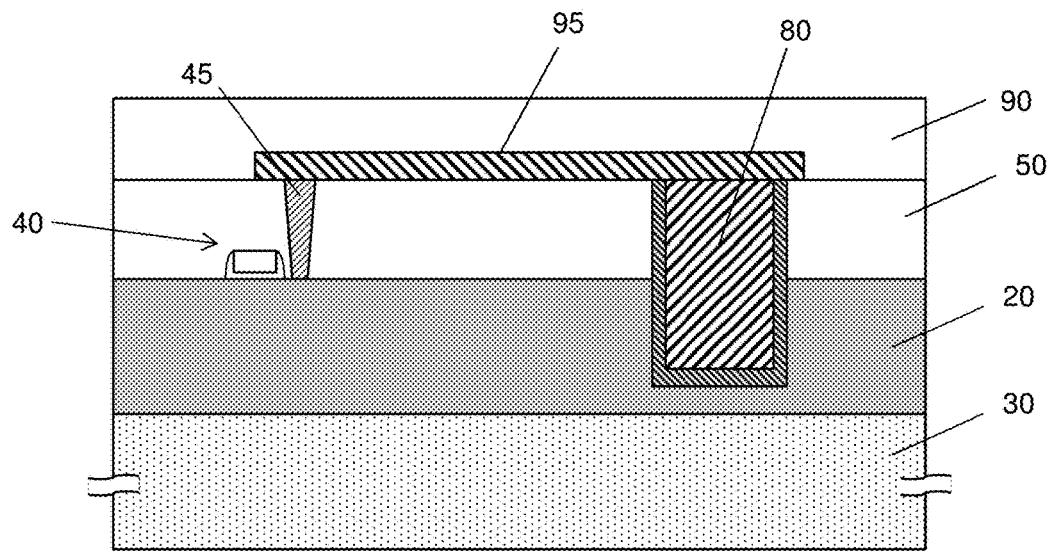
FIG. 7 shows an exemplary cross sectional view illustrating one of the stages of a manufacturing process for a through-silicon via (TSV) structure according to one embodiment of the present disclosure.

FIG. 7 illustrates further process operations in the formation of a TSV. A metal layer 95 is formed over the ILD layer 50 to connect the contact 45 and the via 80. The metal layer 95 may be formed by CVD, PVD or other suitable methods. Although the contact 45 and the via 80 are directly connected by one metal layer 95 in FIG. 7, this merely an illustration of the concept of metal wiring. The contact 45 and the via 80 may be electrically connected by two or more metal layers formed in the same or different wiring layers.

Further, a passivation layer 90 is further formed over the metal layer 95, in order to seal and protect the metal layer 95. The passivation layer 90 may include a dielectric material such as an oxide or silicon nitride, although other suitable dielectrics, such as a high-k dielectric or polyimide, may alternatively be used. The passivation layer 90 may be formed using a PECVD process, although any other suitable process may alternatively be used. The thickness of the passivation layer 90 is in a range from about 0.6 µm to about 1.5 µm in some embodiments.

In certain embodiments, the passivation layer 90 is patterned to expose at least a portion of the metal layer 95. The passivation layer 90 may be patterned using a suitable photolithographic technique. In the opening, a front connection terminal (not shown) is formed.

Figure 8:
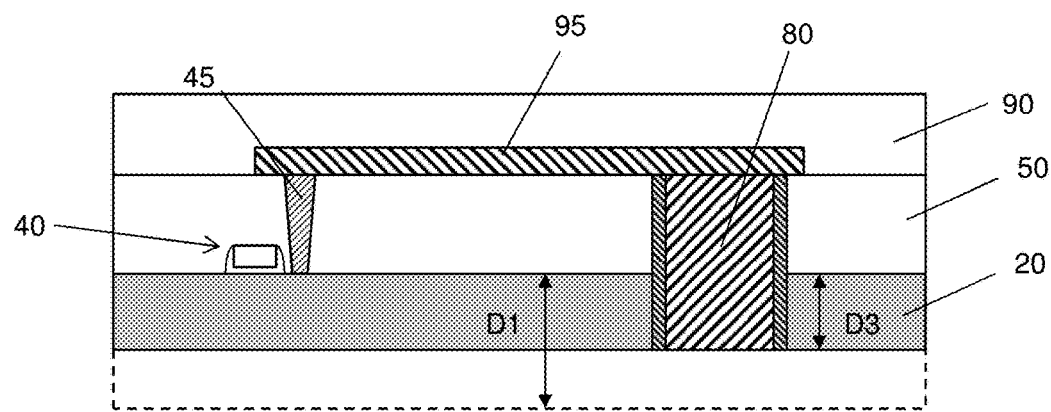
FIG. 8 shows an exemplary cross sectional view illustrating one of the stages of a manufacturing process for a through-silicon via (TSV) structure according to one embodiment of the present disclosure.

After the fabrication process for the front side of the substrate is completed, the bulk layer 30 and a bottom portion of the defect free layer 20 are removed, as shown in FIG. 8, to expose the conductive material 75 of the via 80 located within the opening 60 to complete a TSV. The removal may be performed with a grinding process such as a chemical mechanical polishing (CMP) method, although other suitable processes, such as etching, may alternatively be used. The bulk layer 30 is completely removed and the defect free layer 20 is partially removed such that the remaining thickness D3 of the defect free layer 20 becomes a desired thickness. The thickness D3 is about 50% to about 90% of the thickness D1, in some embodiments. In certain embodiments, D3 is in a range from about 30 µm to about 50 µm.

Figure 9:
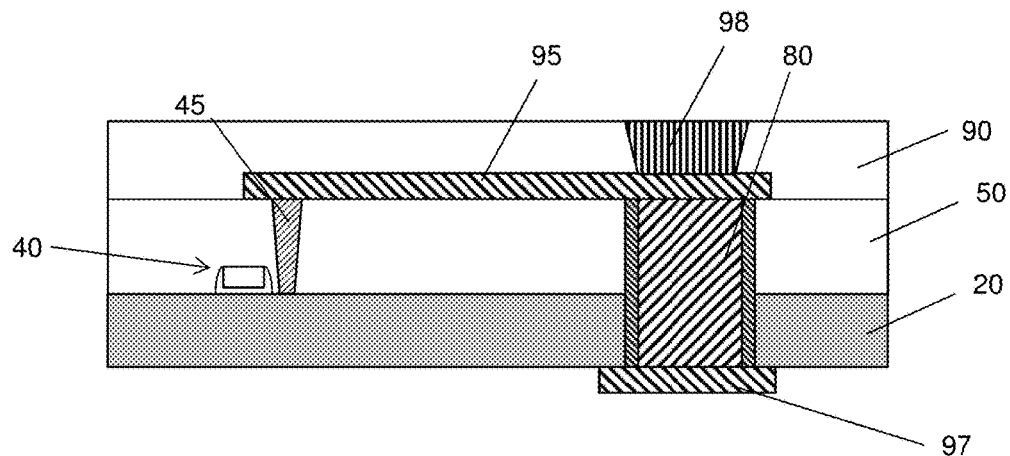
FIG. 9 shows an exemplary cross sectional view illustrating one of the stages of a manufacturing process for a through-silicon via (TSV) structure according to one embodiment of the present disclosure.

After the bottom of the via 80 is exposed, a bottom connection terminal 97 is formed as shown in FIG. 9. In some embodiments, an upper connection terminal 98 is formed on the metal layer 95 for an external connection. The upper and bottom connection terminals may comprise a conductive layer, such as Ni, Au or an alloy thereof.

As shown in FIG. 9, the TSV 80 in the substrate is surrounded by the defect free layer 20 in the substrate, and no bulk layer containing BMDs is in contact with the TSV 80.

Figure 10:
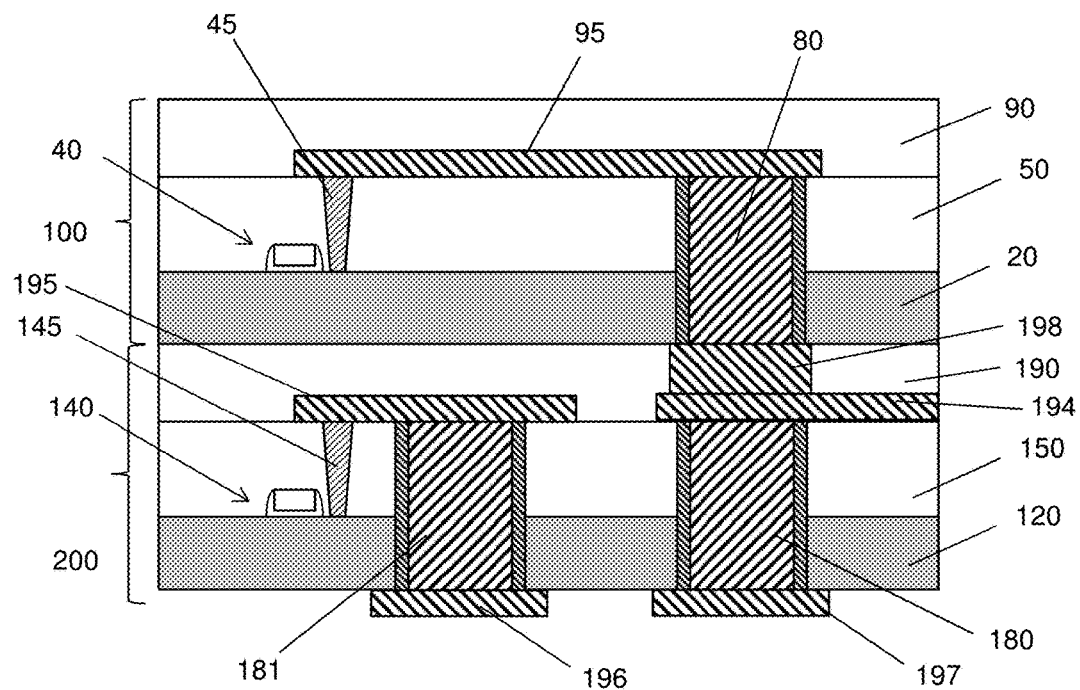
FIG. 10 shows an exemplary device structure according to another embodiment of the present disclosure.

In other embodiments, as shown in FIG. 10, two substrates are electrically connected through the via (TSV) 80. In FIG. 10, a first substrate 100 has a similar structure as the structure show in FIG. 8. A second substrate 200 is formed by the operations disclosed with respect to FIGS. 1-9, and includes a defect free layer 120, electronic devices 140, a contact 145, a first ILD layer 150, two TSVs 180, 181, metal layers 194, 195, a second ILD layer 190, and bottom connection terminals 196, 197. The second substrate 200 further includes a connection terminal 198, by which the first substrate 100 and the second substrate 200 are electrically connected. Of course, more than two substrates can be stacked by a similar manner.

Figure 11:
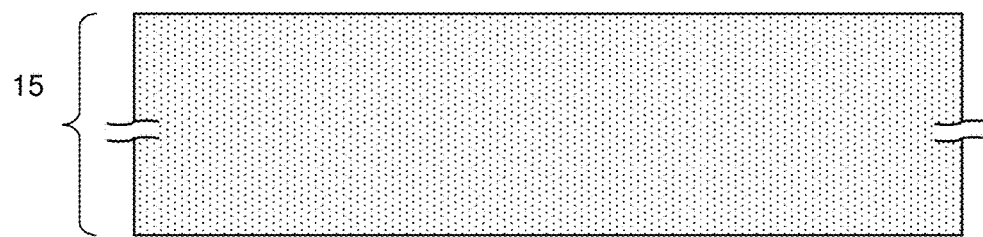
FIG. 11 shows an exemplary cross sectional view illustrating one of the stages of a manufacturing process for a TSV structure according to one embodiment of the present disclosure.
Figure 12:
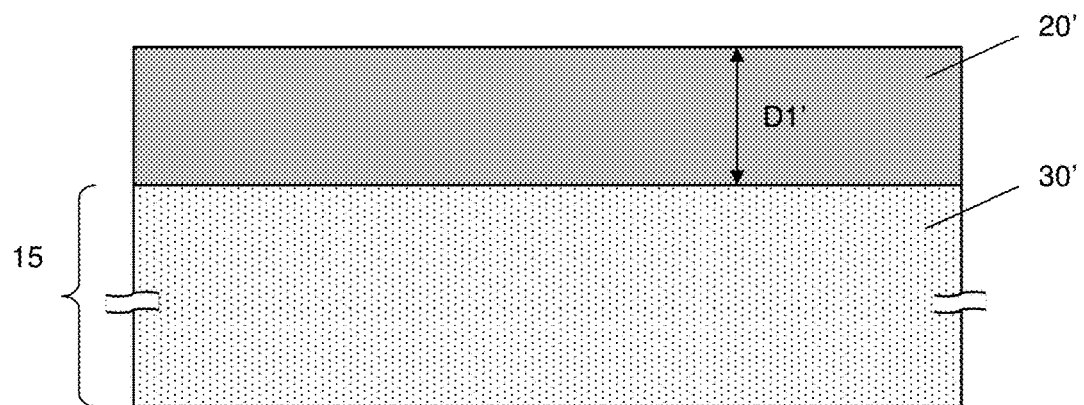
FIG. 12 shows an exemplary cross sectional view illustrating one of the stages of a manufacturing process for a TSV structure according to one embodiment of the present disclosure.

FIGS. 11 and 12 show exemplary cross sectional views illustrating a manufacturing process of a TSV structure according to one embodiment of the present disclosure. The similar or the same configurations, dimensions, processes, materials and/or structures as set forth above may be employed in the following embodiment, and the detailed explanation may be omitted.

In FIG. 11, a substrate 15 is provided. The substrate 15 has the same configuration as the substrate 10. As shown in FIG. 12, an epitaxial layer 20' is formed over the substrate 15. In this embodiment, for example, the substrate 15 is a Si substrate (wafer) and the epitaxial layer 20' is a Si epitaxial layer. After the epitaxial layer 20' is formed, the operations disclosed with respect to FIGS. 3-9 are performed.

Since the layer 20' is formed by an epitaxial growth method, the epitaxial layer 20' is substantially defect-free (i.e., the defect free layer). The density of BMDs in the defect free layer 20' is substantially zero (e.g., less than 100 cm$^{-3}$). In certain embodiments, the density of BMDs in the defect free layer 20' is zero.

In some embodiments, the thickness D1' of the defect free layer 20' is in a range from about 30 μm to about 200 μm. In certain embodiments, D1 is equal to or more than about 50 μm. The substrate 15 can be referred to as a bulk layer 30', which still contains BMDs equal to or more than 1×10$^8$ cm$^{-3}$. Similar to the foregoing embodiment, the thickness D1' of the defect free layer 20' is such a thickness that the bottom of the opening 60 (see, FIG. 4) does not reach the substrate 15 (bulk layer 30').

Figure 13:
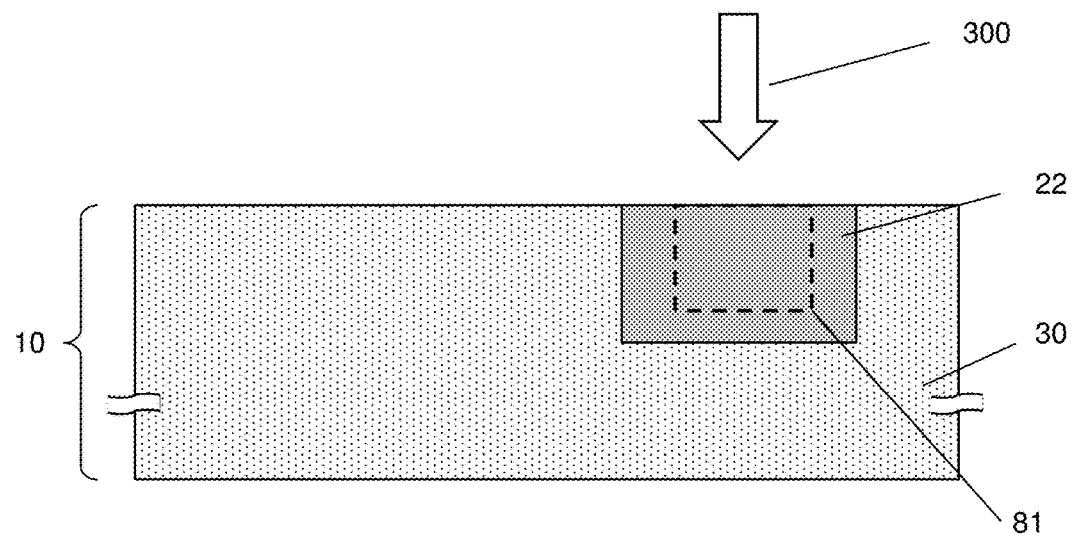
FIG. 13 shows an exemplary cross sectional view illustrating a manufacturing process of a TSV structure according to another embodiment of the present disclosure.

FIG. 13 shows an exemplary cross sectional view illustrating a manufacturing process of a TSV structure according to another embodiment of the present disclosure. The similar or the same configurations, dimensions, processes, materials and/or structures as set forth above may be employed in the following embodiment, and the detailed explanation may be omitted.

In this embodiment, the defect free region 22 is selectively formed in an area 81 of the substrate 10, where the opening 60 (TSV 80) (see, FIGS. 4 and 6) is subsequently formed. To selectively apply heat to form the defect free region 22, for example, a laser annealing method 300 can be used. By applying the laser 300, the substrate 10 is locally heated at about 1200° C. to about 1250° C., and the heated area becomes a BMD free region 22.

The laser 300 may also be applied from the back side of the substrate 10. In such a case, the BMD free region 22 may be formed from the front surface to the back surface of the substrate 10. Further, an opening 60 (see, FIG. 4) may be formed deeper than the case of FIG. 4.

Figure 14:
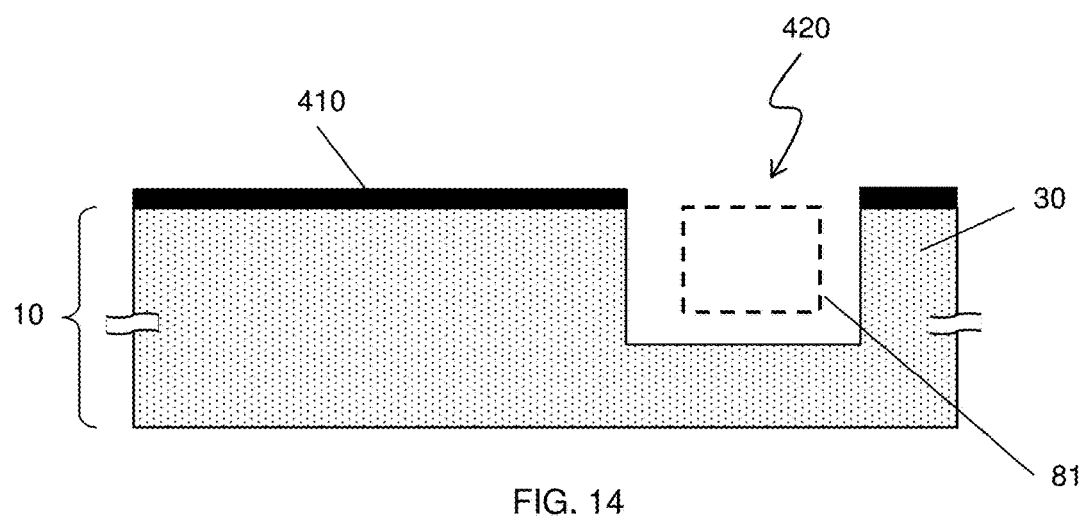
FIG. 14 shows an exemplary cross sectional view illustrating one of the stages of a manufacturing process for a TSV structure according to another embodiment of the present disclosure.
Figure 15:
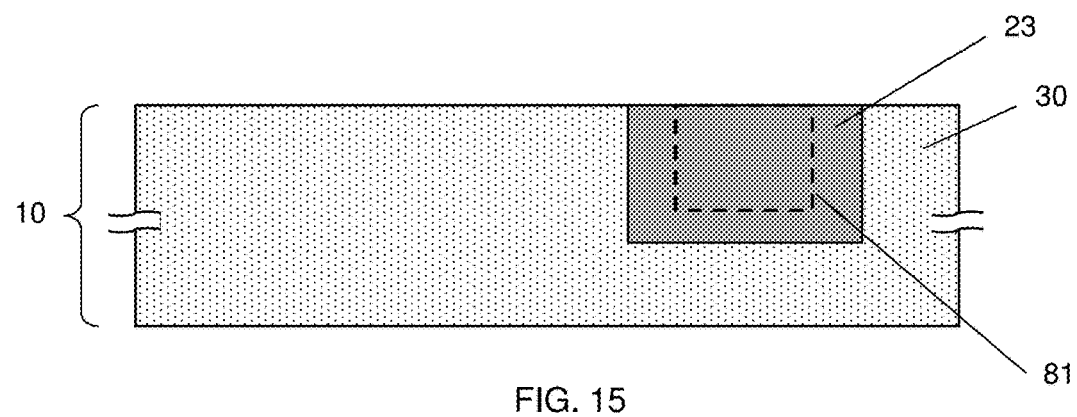
FIG. 15 shows an exemplary cross sectional view illustrating one of the stages of a manufacturing process for a TSV structure according to another embodiment of the present disclosure.

FIGS. 14 and 15 show exemplary cross sectional views illustrating a manufacturing process of a TSV structure according to another embodiment of the present disclosure. The similar or the same configurations, dimensions, processes, materials and/or structures as set forth above may be employed in the following embodiment, and the detailed explanation may be omitted.

In this embodiment in an area 81 of the substrate 10, where the opening 60 (TSV 80) is subsequently formed.

As shown in FIG. 14, the substrate 10 is etched by using a mask pattern 410 to form an opening 420 in an area 81 of the substrate 10, where the opening 60 (TSV 80) is subsequently formed. The mask pattern 410 may include one or more layers of silicon oxide and silicon nitride. With the mask pattern 410 remaining on the substrate 10, a selective epitaxial growth is performed to form an epitaxial layer 23, i.e., a defect free layer, in the opening 420. Subsequently, the mask pattern 410 is removed. In some embodiments, a planarization operation, such as chemical mechanical polishing (CMP), is used to remove an excess epitaxial layer.

The various embodiments or examples described herein offer several advantages over the existing art. For example, in the present disclosure, since a defect free layer is formed in or on the substrate and an opening for a TSV does not reach a bulk layer with BMDs, it is possible to prevent adverse effects on the TSV otherwise caused by BMDs. Further, since the bulk layer with BMDs still remains under the electronic devices, it is possible to utilize the bulk layer as a metal impurity gettering layer.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a thermal treatment is performed on a substrate, thereby forming a defect free layer in an upper layer of the substrate, where a remaining layer of the substrate is a bulk layer. The bulk layer contains bulk micro defects as defects and a density of the defects in the bulk layer being equal to or more than 1×10$^8$ cm$^{-3}$. An electronic device is formed over the defect free layer. An opening is formed in the defect free layer such that the opening does not reach the bulk layer. The opening is filled with a conductive material, thereby forming a via. The bulk layer is removed so that a bottom part of the via is exposed. A density of defects in the defect free layer is less than 100 cm$^{-3}$.

In accordance with another aspect of the present disclosure, in a method of method of manufacturing a semiconductor device, an electronic device is formed over a substrate having a defect free layer and a bulk layer. The bulk layer contains bulk micro defects as defects and a density of the defects in the bulk layer being equal to or more than 1×10$^8$ cm$^{-3}$. An opening is formed in the defect free layer such that the opening does not reach the bulk layer. The opening is filled with a conductive material, thereby forming a via. The bulk layer is removed so that a bottom part of the via is exposed. A density of defects in the defect free layer is less than 100 cm$^{-3}$.

In accordance with another aspect of the present disclosure, a semiconductor device comprising, a first substrate with a first electronic device and a connection terminal electrically connected to the first electronic device; and a second substrate with a second electronic device and a via passing through the second substrate and electrically connected to the second electronic device. The first substrate is attached to the second substrate so that the connection terminal is in contact with the via, and the via is surrounded by a defect free layer of the second substrate. A density of defects in the defect free layer is less than 100 cm$^{-3}$, where the defects are bulk micro defects.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   performing a thermal treatment on a substrate, thereby forming a defect free layer in an upper layer of the substrate, a remaining layer of the substrate being a bulk layer, the bulk layer containing bulk micro defects as defects and a density of the defects in the bulk layer being equal to or more than 1×10$^8$ cm$^{-3}$;
   forming an electronic device over the defect free layer;
   forming an opening in the defect free layer such that the opening does not reach the bulk layer;
   filling the opening with a conductive material, thereby forming a via; and
   removing the bulk layer so that a bottom part of the via is exposed, wherein a density of defects in the defect free layer is less than 100 cm$^{-3}$.

2. The method of claim 1, wherein the density of defects in the defect free layer is zero.

3. The method of claim 1, wherein a thickness of the defect free layer before forming the electronic device is in a range from 30 μm to 200 μm.

4. The method of claim 3, wherein a depth of the opening is 70% to 90% of the thickness of the defect free layer.

5. The method of claim 1, wherein in the thermal treatment, the substrate is heated at a temperature in a range from 1010° C. to 1040° C.

6. The method of claim 5, wherein the thermal treatment is performed for a time period in a range from 10 sec to 15 sec.

7. The method of claim 6, wherein, after the thermal treatment is performed, a cooling process is performed at a cooling rate in a range from 15° C./sec to 25° C./sec.

8. The method of claim 1, wherein the thermal treatment is performed at a temperature in a range from 1200° C. to 1250° C.

9. The method of claim 1, wherein the filling the opening with a conductive material includes:
forming a barrier layer; and
forming a main conductive layer on the barrier layer.

10. The method of claim 9, wherein the barrier layer includes at least one of TiN, Ti, TaN and Ta, and the main conductive layer includes Cu or a Cu alloy.

11. The method of claim 1, further comprising:
attaching another substrate having a connection terminal to a bottom surface of the substrate where the via is exposed so that the exposed via is connected to the connection terminal.

12. A method of manufacturing a semiconductor device, comprising:
forming an electronic device over a substrate having a defect free layer and a bulk layer, the bulk layer containing bulk micro defects as defects and a density of the defects in the bulk layer being equal to or more than 1×10$^8$ cm$^{-3}$;
forming an opening in the defect free layer such that the opening does not reach the bulk layer;
filling the opening with a conductive material, thereby forming a via; and
removing the bulk layer so that a bottom part of the via is exposed,
wherein a density of defects in the defect free layer is less than 100 cm$^{-3}$.

13. The method of claim 12, wherein the defect free layer is an epitaxial layer formed on the bulk layer.

14. The method of claim 13, wherein the density of defects in the defect free layer is zero.

15. The method of claim 13, wherein a thickness of the defect free layer before forming the electronic device is in a range from 30 μm to 200 μm.

16. The method of claim 15, wherein a depth of the opening is 70% to 90% of the thickness of the defect free layer.

17. The method of claim 11, wherein the filling the opening with a conductive material includes:
forming a barrier layer; and
forming a main conductive layer on the barrier layer.

18. The method of claim 17, wherein the barrier layer includes at least one of TiN, Ti, TaN and Ta, and the main conductive layer includes Cu or a Cu alloy.

19. The method of claim 11, further comprising:
forming a bottom connection terminal on the exposed via.

20. A semiconductor device comprising:
a first substrate with a first electronic device and a connection terminal electrically connected to the first electronic device; and
a second substrate with a second electronic device and a via passing through the second substrate and electrically connected to the second electronic device, wherein:
the first substrate is attached to the second substrate so that the connection terminal is in contact with the via,
a first passivation layer is provided over the first substrate,
a second passivation layer is provided over the second substrate,
the first substrate is attached to the second substrate such that the first passivation layer and a bottom of the second substrate face with each other,
the via is surrounded by a defect free layer of the second substrate,
a density of defects in the defect free layer is less than 100 cm$^{-3}$, and
the defects are bulk micro defects.

* * * * *